United States Patent
Hsueh et al.

(10) Patent No.: US 9,160,353 B2
(45) Date of Patent: Oct. 13, 2015

(54) PHASE FREQUENCY DETECTOR AND CHARGE PUMP FOR PHASE LOCK LOOP FAST-LOCKING

(71) Applicant: Mediatek Inc., Hsin-Chu (TW)

(72) Inventors: Yu-Li Hsueh, Hsin-Chuang (TW); Jing-Hong Conan Zhan, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/158,657

(22) Filed: Jan. 17, 2014

(65) Prior Publication Data

US 2014/0203853 A1  Jul. 24, 2014

Related U.S. Application Data

(62) Division of application No. 13/548,079, filed on Jul. 12, 2012, now Pat. No. 8,664,985.

(60) Provisional application No. 61/593,974, filed on Feb. 2, 2012.

(51) Int. Cl.
*H03L 7/10*     (2006.01)
*H03L 7/089*    (2006.01)
*H03L 7/107*    (2006.01)

(52) U.S. Cl.
CPC ........ *H03L 7/10* (2013.01); *H03L 7/0891* (2013.01); *H03L 7/0896* (2013.01); *H03L 7/1072* (2013.01)

(58) Field of Classification Search
CPC ....... H03L 7/10; H03L 7/0896; H03L 7/1072; H03L 7/0891

USPC ............ 327/12, 3, 5, 7, 8, 40, 41, 43, 47, 48, 327/49, 141, 155, 156, 157, 159, 160, 161, 327/162, 163, 243, 244

See application file for complete search history.

(56) References Cited

U.S. PATENT DOCUMENTS

| | | |
|---|---|---|
| 5,128,632 A | 7/1992 | Erhart et al. |
| 5,420,545 A | 5/1995 | Davis et al. |
| 5,631,587 A | 5/1997 | Co et al. |
| 5,783,972 A | 7/1998 | Nishikawa |
| 5,872,487 A | 2/1999 | Adachi et al. |
| 6,163,585 A | 12/2000 | Yamawaki et al. |
| 7,002,418 B2 | 2/2006 | Zhu et al. |
| 7,400,204 B2 | 7/2008 | Thomsen et al. |
| 2009/0219068 A1* | 9/2009 | Mizuhashi et al. ........... 327/158 |
| 2012/0062291 A1 | 3/2012 | Saitoh |

OTHER PUBLICATIONS

Mike Keaveney, et al., "A 10us Fast Switching PLL Synthesizer for a GSM/EDGE Base-Station," 2004 IEEE International Solid-State Circuits Conference, Session 10, Cellular Systems and Building Blocks / 10.6, Feb. 17, 2004, 10 pages.

Wei-Hao Chiu, et al., "A Dynamic Phase Error Compensation Technique for Fast-Locking Phase-Locked Loops," IEEE Journal of Solid State Circuits, vol. 45, No. 6, Jun. 2010, pp. 1137-1149.

* cited by examiner

*Primary Examiner* — Jung Kim

(74) *Attorney, Agent, or Firm* — Sawyer Law Group, P.C.

(57) ABSTRACT

The present invention provides for a solution to reduce locking time with satisfactory performance without the need for significant footprint area for the phase lock loop (PLL) circuits by boosting phase frequency detector (PFD) and charge pump (CP) gains through various circuitry configurations that employ one or more flip-flops, delay elements and advanced circuitry techniques.

9 Claims, 14 Drawing Sheets

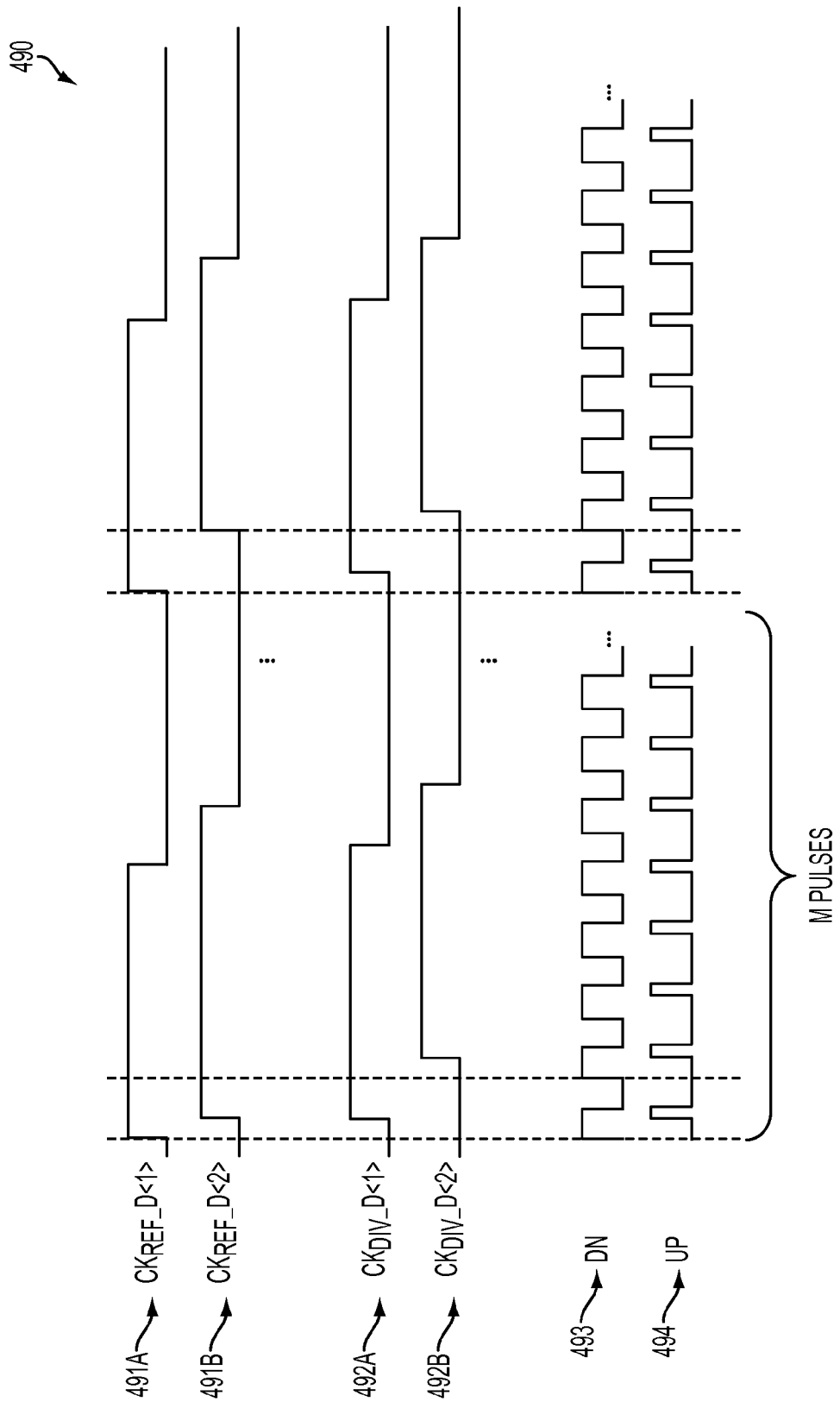

PHASE FREQUENCY DETECTOR AND CHARGE PUMP FOR PHASE LOCK LOOP FAST-LOCKING

CROSS-REFERENCE TO RELATED APPLICATION

Under 35 U.S.C. 120, this application is a Divisional Application and claims priority to U.S. application Ser. No. 13/548,079, filed on Jul. 12, 2012, entitled "PHASE FREQUENCY DETECTOR AND CHARGE PUMP FOR PHASE LOCK LOOP FAST-LOCKING," which claims the benefit of U.S. Provisional Patent Application No. 61/593,974, filed on Feb. 2, 2012, entitled "PHASE FREQUENCY DETECTOR AND CHARGE PUMP FOR PHASE LOCK LOOP FAST-LOCKING," all of which are incorporated herein by reference in their entireties.

FIELD OF THE INVENTION

The present invention relates generally to the efficient use of phase lock loop (PLL) circuits, and more particularly to phase frequency detectors (PFDs) and charge pumps (CPs).

BACKGROUND OF THE INVENTION

Phase Locked Loops (PLL) circuits are electronic circuits that provide for a variable frequency oscillator (VCO) and a phase/frequency detector (PFD) which generate an output signal having a phase that is associated with the phase of an input signal to the PLL. Typically, the PLL attempts to generally provide for phase matching as between the phases of the input signal and the output signal by adjusting the frequency of the VCO based on control signals of the PFD through a feedback loop. A PLL can provide for demodulation by tracking the frequency of the input signal or a PLL may generate a frequency that is a multiple of the frequency of the input signal for frequency synthesis.

PLL circuits have applicability in a variety of electronic equipment including radio, computer, telecommunication equipment and other electronic applications, such as microprocessors. PLL circuits are widely used for synchronization purposes. PLL circuits in digital wireless communication system applications are used to provide the local oscillator for up-conversion during transmission and down-conversion during reception often in microprocessor applications. PLL circuits can also provide for distributing clock pulses.

FIG. 1 depicts a block diagram of a PLL frequency multiplier circuit 100. The input reference signal (frequency reference input) 110 is applied to an input of a PFD 120. A second input of the PFD 120 receives the signal output 115 of a counter 120. In a balanced operation, the frequencies of the input reference signal 110 and the counter output 115 will approximate one another. The PFD 120 provides an output 125 of a voltage proportional to the phase difference between the two signal inputs (110, 115) of the PFD 120, to a loop filter 130. The loop filter 130 typically determines dynamic characteristics of the PLL and provides a control signal 135 to the VCO 140. Ideally, the VCO 140 provides an output 145 at a frequency that is N times the input supplied to the frequency reference input as the frequency output of the PLL at 150. N is defined as an integer herein and throughout. The VCO output 145 is also provided to the counter 120 via 146 as input at 147.

FIG. 2 depicts a block diagram of another PLL circuit 200. In circuit 200, an input reference signal 210 is provided as input to a PFD 220. A second PFD input is provided from the counter output 291 of the counter 290. As in FIG. 1, the PFD 220 compares the two input signals (210, 291) and produces an output up pulse 225 and an output down pulse 226 which are proportional to the phase differences of the two input signals (210, 291). The output pulses (225, 226) are provided as input to the charge pump 230 and act to control switches of the charge pump to adjust current into or out of a capacitor of the charge pump, effectively causing the voltage across the capacitor to increase or decrease, where the charge delivered is therefore dependent on the phase difference. Typically a charge pump in a PLL design is constructed in integrated-circuit (IC) technology, consisting of pull-up, pull-down transistors and on-chip capacitors. The output of the charge pump 235 is preferably passed to a low-pass filter 240 which is then used to tune or drive the VCO 250 creating an output signal frequency 260 that is also used as feedback (e.g., a negative feedback loop) to the counter 290.

In operation, if the output phase drifts, the output signal from the PFD will increase, driving the VCO phase in the opposite direction resulting in a reduction to the phase drift. Similarly, if the phase becomes ahead of the reference, the PFD alters the control signal to the VCO to slow the oscillator of the VCO down. Therefore, the output phase is referred to as being "locked" to the phase of the input reference signal.

What is desired to improve the performance of PLL circuits is to reduce the amount of time required to lock without sacrificing performance in noise or frequency breadth limitations. Various approaches to achieve this objective have been proposed including increasing the charge pump current by a factor of N, while reducing the loop filter zero-resistor by sqrt(N). However, such approaches of bandwidth extension typically require a boost to the charge pump gain thereby requiring additional and significant circuit area. Therefore, a solution to provide a reduced locking time that provides for satisfactory performance without the need for significant footprint area for the PLL circuit by boosting PFD and CP gains is desired. Furthermore, the solution should be applicable to both integer-N and fractional-N PLL, in order to find wide applications in modern communication systems.

The term charge pump herein may refer to charge pumps which are known in the art, to those under and being developed to advance the state of the art, and more particularly to specifically also include as interchangeable with the referential term here, that which is set forth in U.S. Provisional Application No. 61/417,291, filed on Nov. 26, 2010, which is incorporated by reference in its entirety herein by reference.

As used herein the terms device, apparatus, system, etc. are intended to be inclusive, interchangeable, and/or synonymous with one another and other similar arrangements and equipment for purposes of the present invention though one will recognize that functionally each may have unique characteristics, functions and/or operations which may be specific to its individual capabilities and/or deployment.

SUMMARY OF THE INVENTION

The present invention fulfills these needs and has been developed in response to the present state of the art, and in particular, in response to the problems and needs in the art that have not yet been fully solved by currently available technologies.

In one or more embodiments, a method and system in accordance with the present invention provides for a phase frequency detector comprising at least one first flip-flop for providing an up signal responsive to a first clock signal; a first delay element coupled to the at least one first flip-flop, wherein the at least one first flip-flop and the first delay element provides a plurality of delayed up pulses; at least one second flip-flop for providing a down signal responsive to a second clock signal; a second delay element coupled to the at least one second flip-flop; wherein the at least one second flip-flop and the second delay element provide a plurality of delayed down pulses; a first gate for receiving the plurality of delayed up pulses; a second gate for receiving the plurality of delayed down pulses; wherein the delayed up and down pulses are outputted to other circuitry to provide increased gain.

In further embodiments, a method and system in accordance with the present invention provides for a phase frequency detector comprising: a delay element, responsive to a reference clock signal configured to provide a plurality of delayed reference pulses; a feedback divider element, responsive to an input clock signal and a divider input configured to provide a plurality of divided clock pulses; a first gated core circuit and a second gated core circuit responsive to the plurality of delayed reference pulses and the plurality of divided clock pulses configured to provide a plurality of up pulses and a plurality of down pulses to other circuitry.

In one or more embodiments a method and system in accordance with the present invention provides for a programmable feedback divider element.

A method and system in accordance with the present invention provides for a performing solution benefitting from providing for a reduced locking time by boosting PFD and CP gains without the need for significant footprint area for the PLL circuit.

Further embodiments, forms, objects, features, advantages, aspects, and benefits of the present application shall become apparent from the detailed description and drawings included herein.

BRIEF DESCRIPTION OF THE DRAWINGS

FIG. 4B illustrates a timing diagram of a phase frequency detector circuit of FIG. 4A, in accordance with an embodiment of the present invention.

DETAILED DESCRIPTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1:
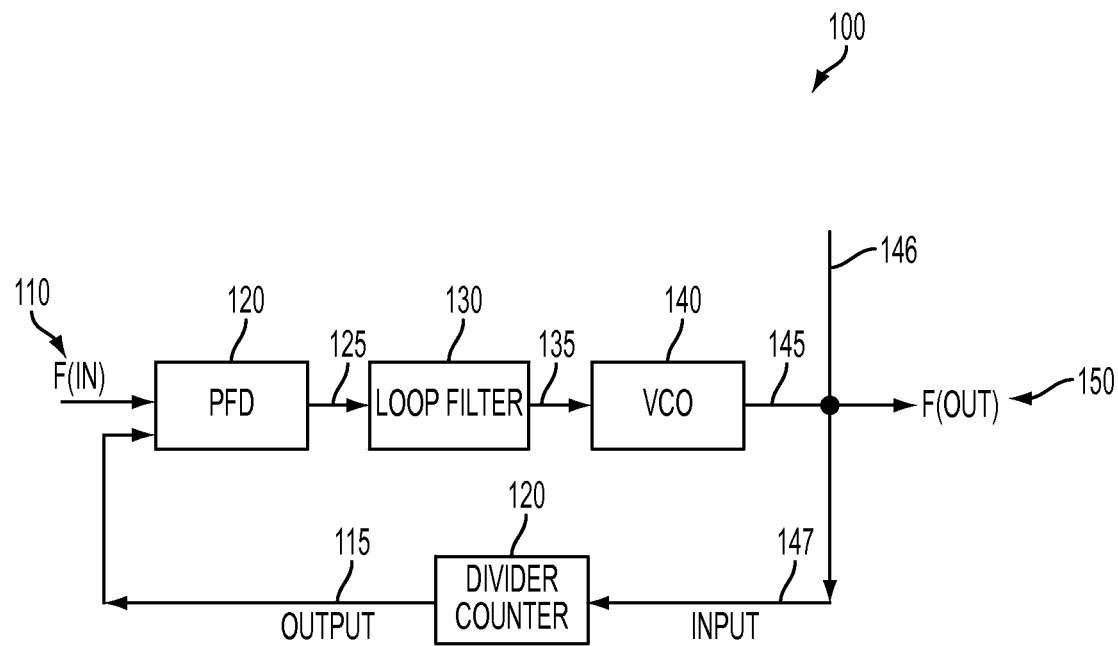
FIG. 1 depicts a block diagram of a conventional PLL frequency multiplier circuit.
Figure 2:
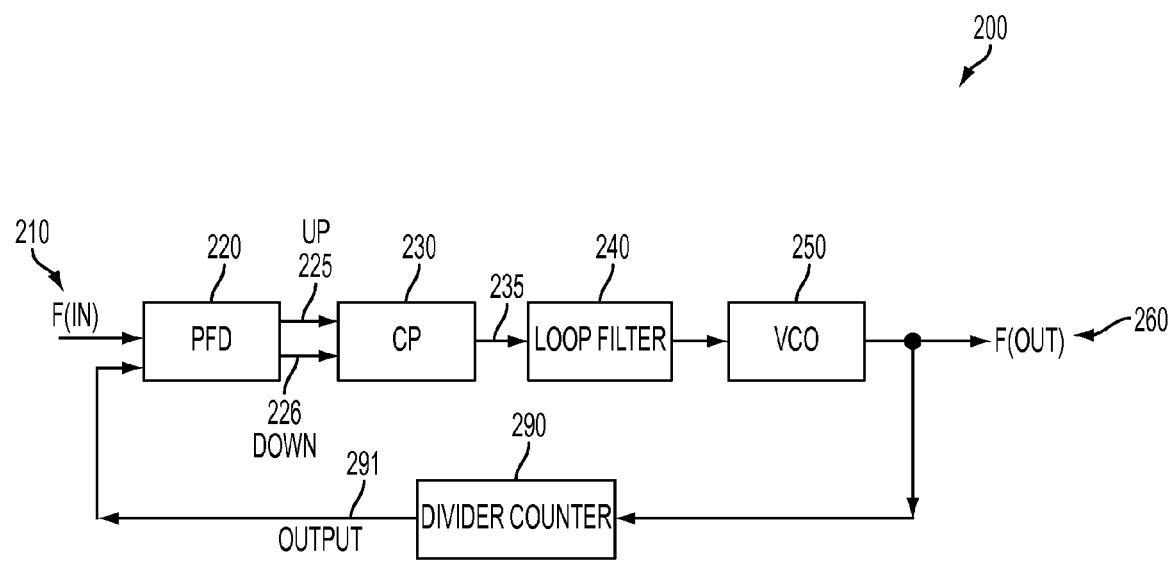
FIG. 2 illustrates a block diagram of another conventional PLL circuit.
Figure 3A:
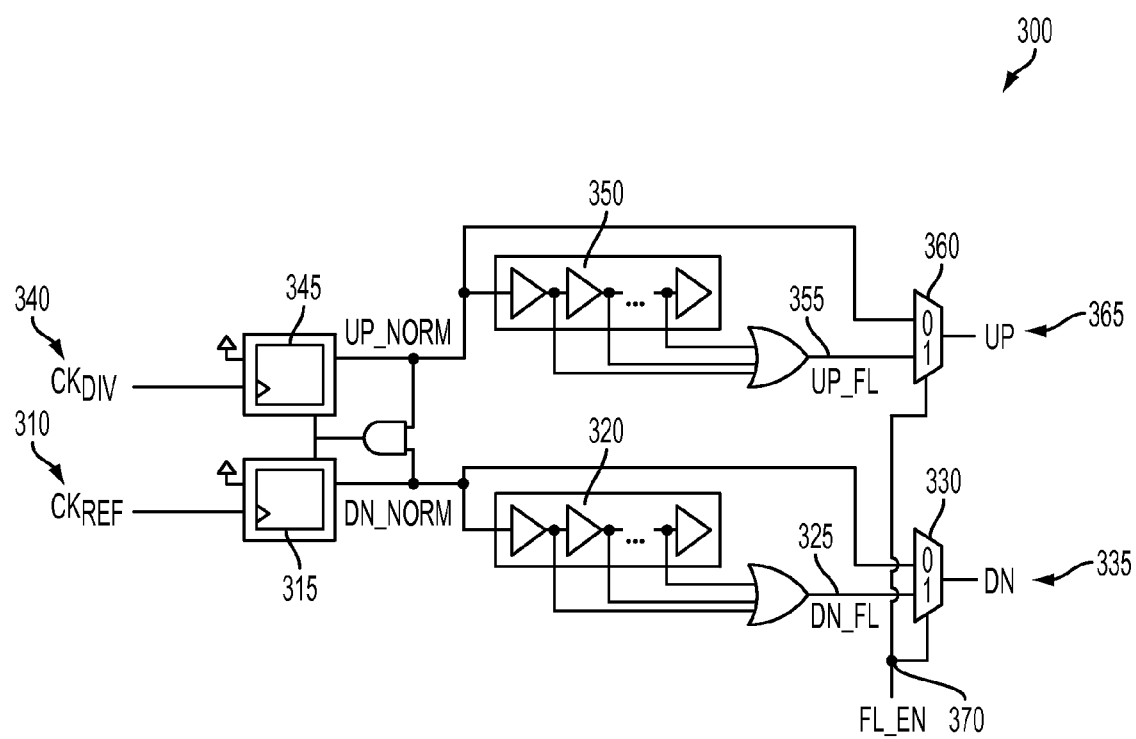
FIG. 3A illustrates a phase frequency detector circuit in accordance with an embodiment of the present invention.

FIG. 3A illustrates a phase frequency detector circuit 300 in accordance with an embodiment of the present invention. In FIG. 3A, a PFD circuit is provided 300 where a reference clock signal (CKref) 310 is inputted to a first flip-flop 315 and the output of a normal down pulse of the first flip flop 315 is provided as input to a first delay element 320 coupled with the first flip-flop 315. The first delay element 320 provides a plurality of delayed reference down pulses at 325. The delayed reference down pulses of 325 are provided as input to the gate coupled to the multiplexer at 330. The reference down pulses from the output of the first flip-flop are also provided as input to the gate coupled to the multiplexer at 330. The multiplexer 330, when enabled, then provides a down pulse to other circuitry when operable coupled to the PFD at 335.

Also as part of the PFD circuit of 300 is a divided clock signal (CKdiv) 340 which is inputted to a second flip-flop 345 and the output of a normal up pulse of the second flip flop 345 is provided as input to a second delay element 350 coupled with the second flip-flop 345. The second delay element 350 provides a plurality of delayed divided up pulses at 355. The delayed divided up pulses of 355 are provided as input to the gate coupled to the multiplexer at 360. The normal up pulses from the output of the second flip-flop are also provided as input to the gate coupled to the multiplexer at 360. The multiplexer 360, when enabled, then provides an up pulse to other circuitry when operable coupled to the PFD at 365. Fast Lock Control Signal (FL_EN) is provided to switch the multiplexer 330 and 360 to output the delayed divided up/down pulses or the normal up/down pulses. For example, a controller operative in relation to the operating mode of the phase lock loop provides the FL_EN signal.

In the above description, it will be appreciated by those skilled in the art that the processing pathways of the inputted signal is more important than the designation of "first" or "second."

In an embodiment, one or more of the delay elements 320, 350 comprise one or more delay chains and one or more cyclic delay elements. In a further embodiment, other circuitry comprises at least one charge pump. In a further embodiment, an adaptive mechanism may be further coupled to the first and second delay elements, which adaptively adjusts or alternates the first and second delay elements, are on successive clock cycles to minimize delay mismatch between the first and second delay elements. Further, as used herein, a flip-flop may include a D-flip-flop or more than one flip-flop or D-flip-flop.

Figure 3B:
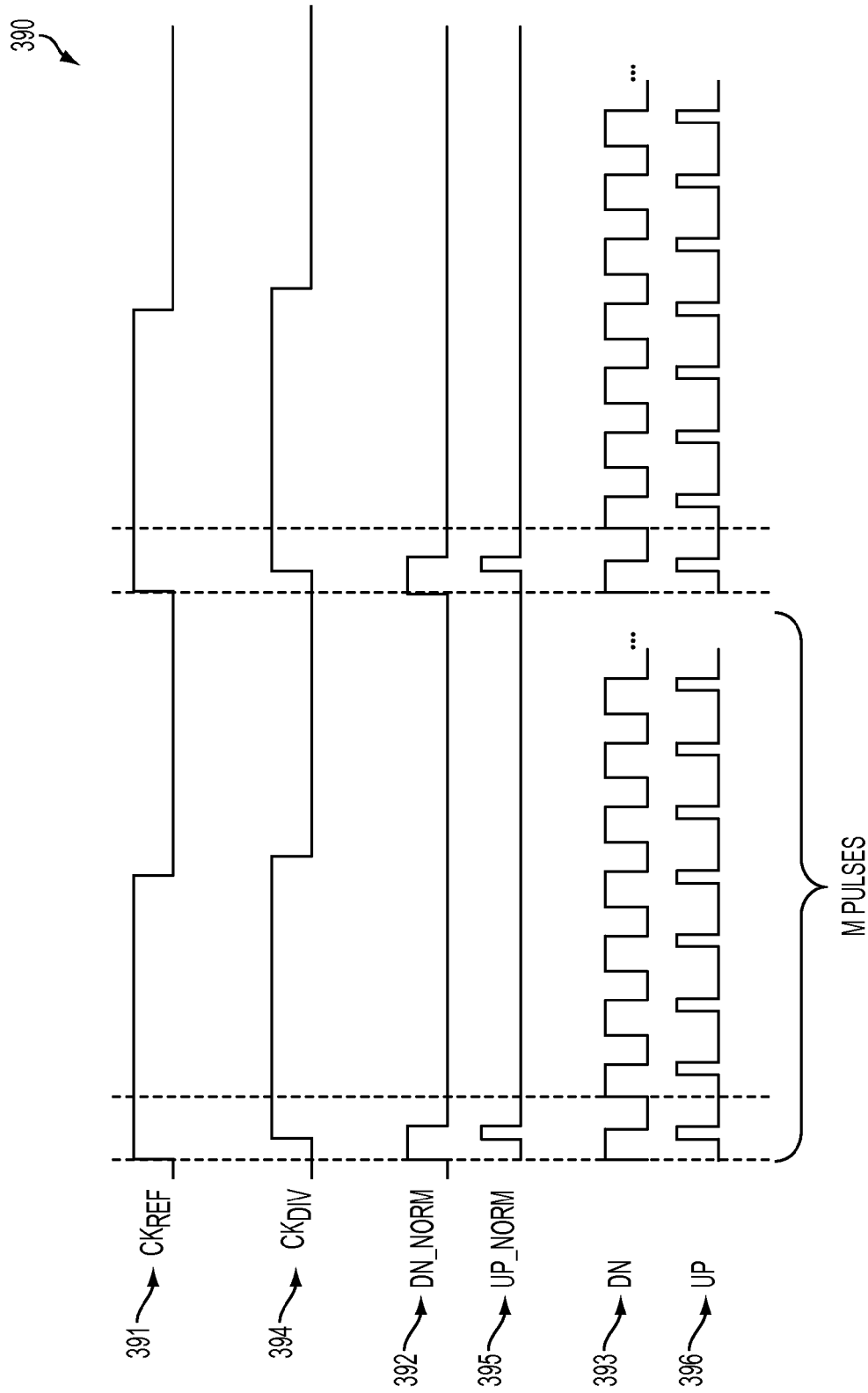
FIG. 3B illustrates a timing diagram of the phase frequency detector circuit of FIG. 3A, in accordance with an embodiment of the present invention.

FIG. 3B illustrates a timing diagram of the phase frequency detector circuit of FIG. 3A, in accordance with an embodiment of the present invention. From FIG. 3B, a reference clock signal (CKref) 391 is inputted to a first flip-flop and the output of a normal down pulse of the first flip-flop, is set forth at 392, which is then provided as input to a first delay element coupled with the first flip-flop to provide a plurality of delayed reference down pulses. The delayed reference down pulses are provided as input to the gate coupled to the multiplexer of the PFD of FIG. 3A. The multiplexer, when enabled, then provides a down pulse to other circuitry at 393. Also as part of the PFD circuit of FIG. 3A, is a divided clock signal (CKdiv) 394 which is inputted to a second flip-flop and the output of a normal up pulse of the second flip flop of 395 is provided as input to a second delay element coupled with the second flip-flop to provide a plurality of delayed divided up pulses. The delayed divided up pulses are provided as input to the gate coupled to the multiplexer of the PFD of FIG. 3A. The multiplexer, when enabled, then provides an up pulse to other circuitry at 396.

Figure 4A:
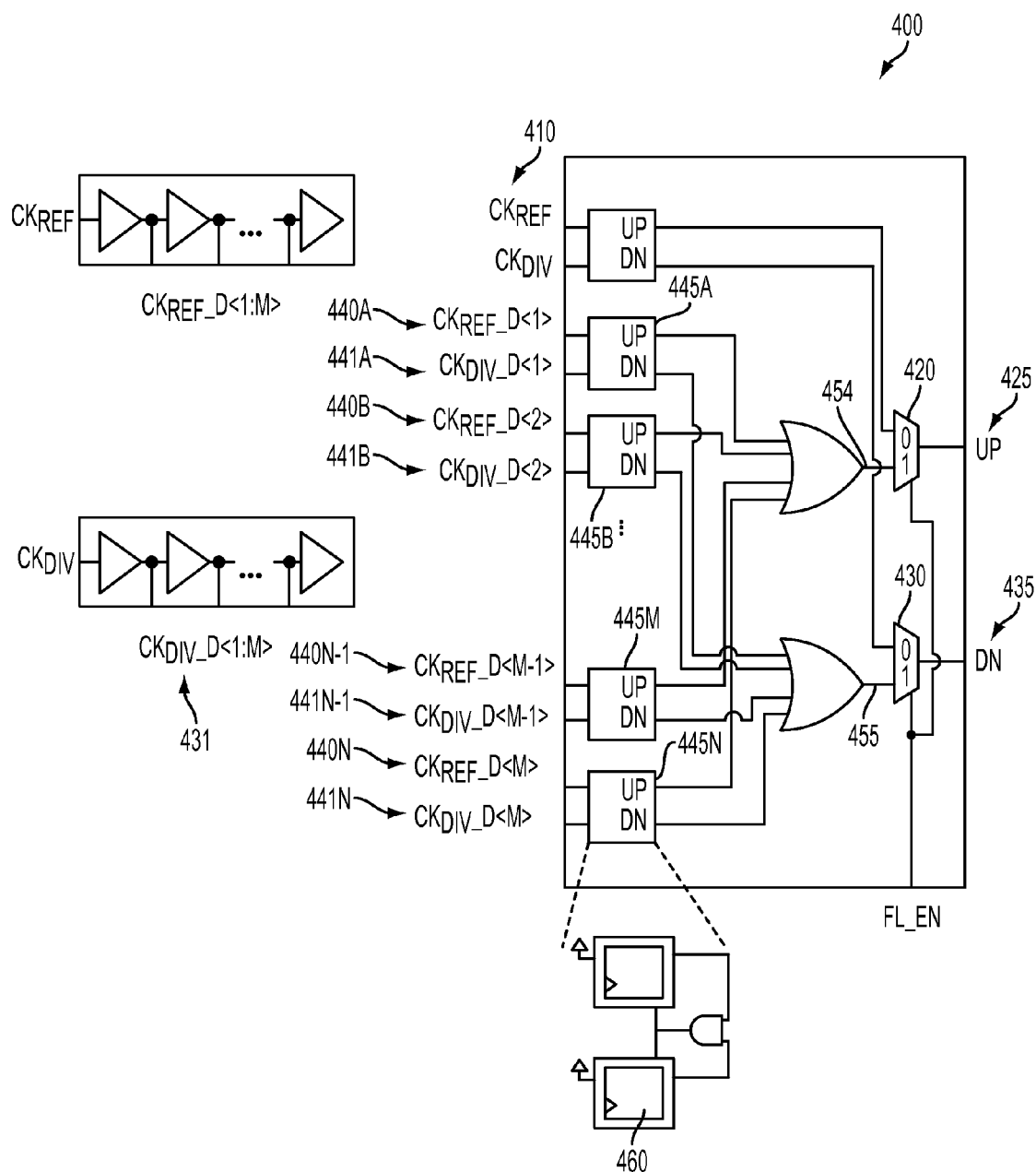
FIG. 4A illustrates a phase frequency detector circuit having a plurality of flip-flops in accordance with an embodiment of the present invention.

FIG. 4A illustrates a phase frequency detector circuit having a plurality of flip-flops in accordance with an embodiment of the present invention. In FIG. 4A, a PFD circuit is provided 400 where a reference clock signal (CKref) 410, which is delayed via a delay element 411, is inputted to at least one first flip-flop 415 comprising a first plurality of flip-flops. The PFD circuit of FIG. 4A also illustrates a divider clock signal (CKdiv) 430 that is delayed via a delay element 431, is inputted to at least one first flip-flop 415 comprising a first plurality of flip-flops.

The plurality of flip-flops provides an up signal responsive to the delayed reference clock signal input and to the delayed divided clock signal input to the gate coupled with a multiplexer at 420. The multiplexer 420, when enabled, based on the plurality of inputs, provides additional gain via an up pulse to other circuitry at 425. The plurality of flip-flops also provides a down signal responsive to the delayed reference clock signal input and to the delayed divided clock signal input to the gate coupled with a multiplexer at 430. The multiplexer 420, when enabled, based on the plurality of inputs, provides additional gain via an up pulse to other circuitry at 425, and a down pulse to other circuitry at 435.

From FIG. 4A, at least one second flip-flop comprising a second plurality of flip-flops is provided for at 445a-445n. The embodiment is able to accommodate a plurality of additional second flip-flops, each having inputs of a delayed reference clock signal (440a-440n) and a delayed divided clock signal (441a-441n), where the delayed signals are predetermined to be at specific delayed values (e.g., D<1, . . . D<M-1). The at least one second flip-flop is included for providing up and down signals responsive to the respective delayed signal inputs coupled to a second delay element, where each provides for a plurality of delayed down pulses is provided for at 455 and a plurality of delayed up pulses is provided for at 454. An example of a plurality of flip-flops in a simple form is provided at 460 where two D-flip-flops are operably configured as is understood in the art.

At 420 is a first gate for receiving the plurality of delayed up pulses and having a first gate output coupled to a first multiplexer, which provides an up signal at 425. At 430 is a second gate for receiving the plurality of delayed down pulses and having a second gate output coupled to a second multiplexer, which provides a down signal at 435. The first and second multiplexers (420, 430) are capable to provide increased gain by providing the delayed up and down pulses to other circuitry.

In an embodiment, one or more of the delay elements 411, 431 comprise one or more delay chains and one or more cyclic delay elements. In a further embodiment, other circuitry comprises at least one charge pump. Further, as used herein, a flip-flop may include a D-flip-flop or more than one flip-flop or D-flip-flop.

FIG. 4B illustrates a timing diagram of a phase frequency detector circuit of FIG. 4A, in accordance with an embodiment of the present invention. From FIG. 4B, the PFD of FIG. 4A is able to accommodate a plurality of additional second flip-flops, each having inputs of the delayed reference clock signal and a delayed divided clock signal, where the delayed signals are predetermined to be at specific delayed values (e.g., D<1>, . . . D<M-1>) at 491a, 491b for the delayed reference clock signal and at 492a, 492b for the delayed divided clock signal. The delayed signals inputted into the at least one second flip-flop of the PFD provide for up and down signals responsive to the respective delayed signal inputs coupled to a second delay element at 493 and 494 respectively. At 493, a plurality of delayed down pulses is provided for and at 494 a plurality of delayed up pulses is provided for increased gain.

Figure 5A:
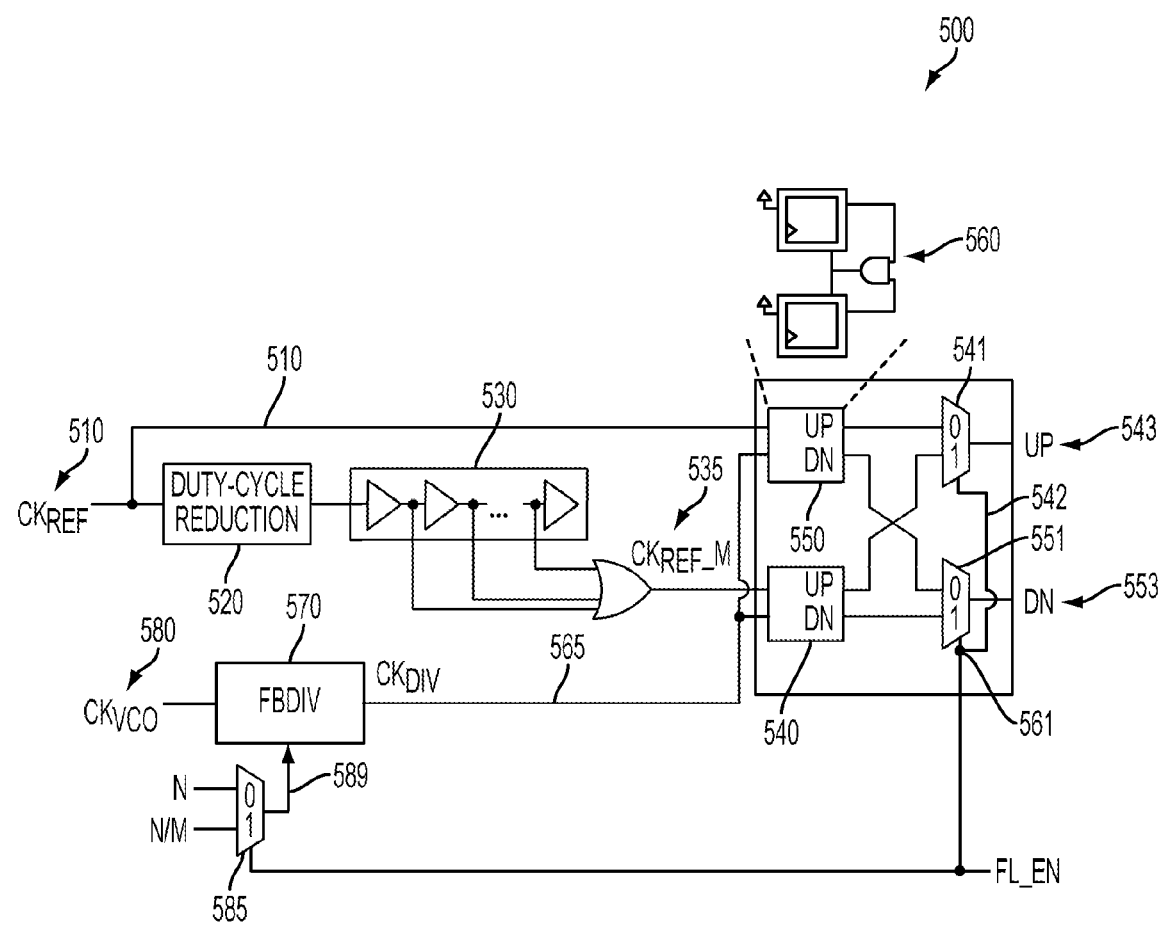
FIG. 5A illustrates a phase frequency detector circuit having delayed reference pulses in accordance with an embodiment of the present invention.

FIG. 5A illustrates a phase frequency detector circuit having delayed reference pulses in accordance with an embodiment of the present invention. In FIG. 5A, a PFD circuit is provided 500 where a reference clock signal (CKref) 510 is input to a duty cycle reduction element 520. As duty cycle is the ratio of the output high time to the total cycle time, the duty cycle reduction element, preferably where one is programmable, is able to provide for manipulation to the position of the positive and negative edges of the clock. The output of the duty cycle reduction element is input to the delay chain 530, where the phase of the clock signal may be enhanced, typically for negative delay. Output of delayed reference pulses 535 (CKref_m) are output from the delay chain 530 and are input to a first gated core circuit 540 and a second gated core circuit 550. As used herein the core circuit is understood in the art to be a plurality of D-flip-flop circuits configurably arranged as depicted at 560 and able to provide a plurality of up pulses and a plurality of down pulses in response to received pulses.

Additional input to the first gated core circuit includes a plurality of divided clock pulses (CKdiv) 565 that are output from the feedback divider element 570. The feedback divider element 570 determines its output in relation to input from the input clock signal (CKvco) 580 and divider input 589 which are associated with the output of a multiplexer 585 being value of either N or N/M, where N is an integer and M is a pulse value. For example, the feedback divider element 570 includes programmable logic.

The divided clock pulses (CKdiv) 565 is an input to both the first and second gated core circuits (540, 550). The delayed reference pulses (CKref_m) 535 is an input to the first gated core circuit. The reference clock signal (CKref) 510 is also an input to the seconded gated core circuit.

The first gated core circuit 540, in response to the inputs defined above, provides a plurality of up and down pulses as output. The up pulses output from the first gated core circuit 540 may be provided to a multiplexer at 541, where the multiplexer selects (via 0,1) to be a first output at 542 and provides an up pulse to other circuitry which may be operable connected at 543. The down pulses output from the first gated core circuit 540 may be provided to a multiplexer at 551, where the multiplexer selects (via 0,1) to be a second output at 552 and provides a down pulse to other circuitry which may be operable connected at 553. For example, the term "other circuitry" may include electronic circuits, microprocessors and electronic apparatuses which may connect to the PFD; however, the use herein is intended to minimally include at least one charge pump responsive to receiving one or more signals from the phase frequency detector. In one or more embodiments, other circuitry may be a charge pump.

The second gated core circuit 550, in response to the inputs defined above, provides a plurality of up and down pulses as output as well. The up pulses output from the second gated core circuit 550 may be provided to a multiplexer at 541, where the multiplexer selects (via 0,1) via signal 542 to be a first output and provides an up pulse to other circuitry which may be operably connected at 543. The down pulses output from the second gated core circuit 550 may be provided to a multiplexer at 551, where the multiplexer selects (via 0,1) via signal 542 to be a second output and provides a down pulse to other circuitry which may be operably connected at 553. For the avoidance of doubt, each gated core circuit and each multiplexer is capable of receiving multiple inputs, where their respective outputs are determined in relation to the received inputs. When enabled, the multiplexers 541, 551 provide the up and down pulses to other circuitry to provide increased gain.

The enable inputs of multiplexers 541 and 551 are combined at 561 with the Fast Lock Control signal (FL_EN) as an input to the multiplexer 585 in a feedback loop. The FL_EN as input causes the multiplexer 585 to determine which divider input 589 value to assign, either N or N/M.

In an embodiment, operably, the input clock signal 580 is of a value associated with a voltage controlled oscillator and the integer value of N is equal to the frequency of the VCO divided by a reference frequency of the plurality of reference clock pulses. In a further embodiment, the delay element 530 comprises one or more delay chains and one or more cyclic delay elements.

Figure 5B:
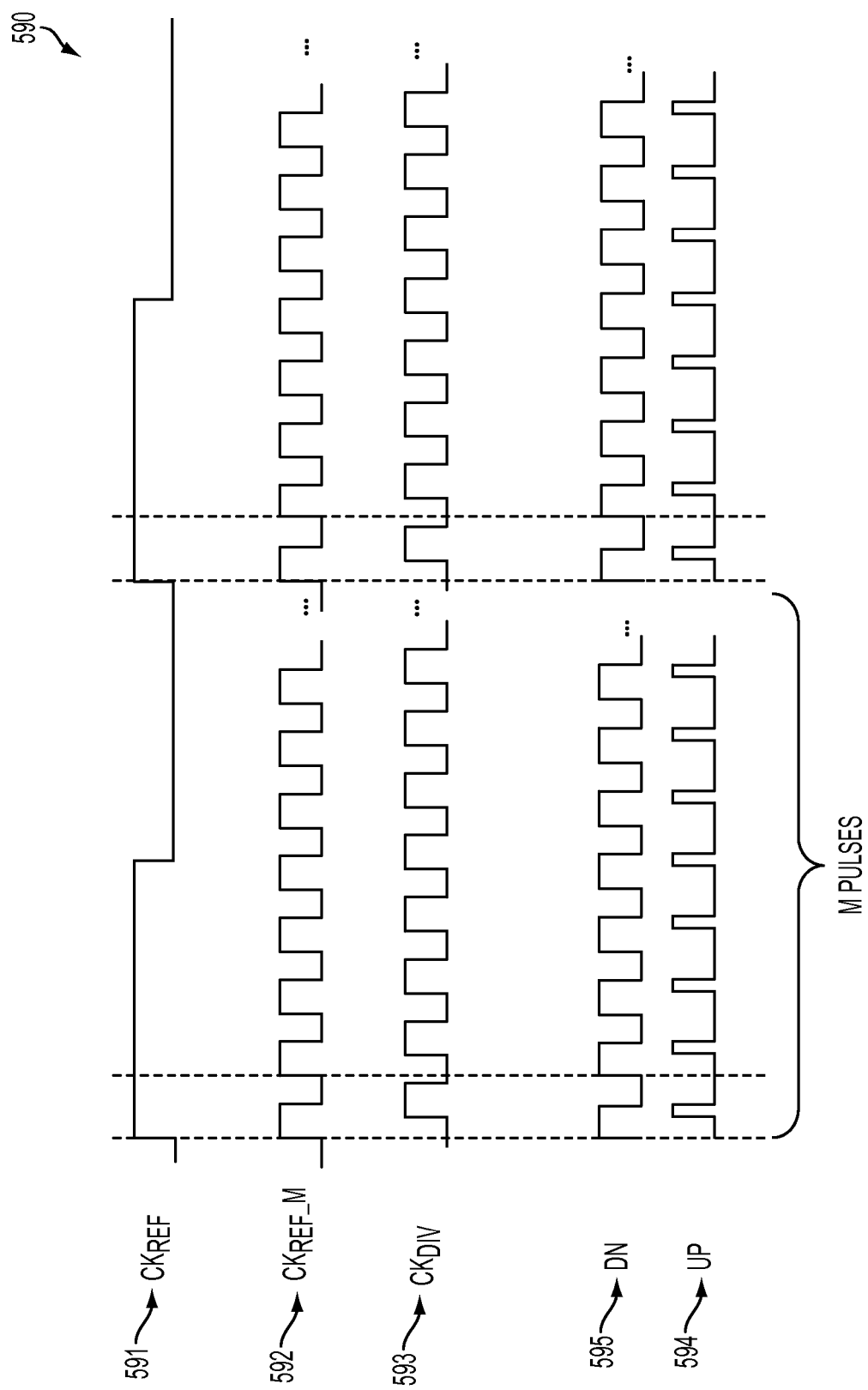
FIG. 5B illustrates a timing diagram of a phase frequency detector circuit of FIG. 5A, in accordance with an embodiment of the present invention.

FIG. 5B illustrates a timing diagram of a phase frequency detector circuit of FIG. 5A, in accordance with an embodiment of the present invention. From FIG. 5B, a reference clock signal (CKref) 591 is input to a duty cycle reduction element and the output is input to the delay chain. The output of delayed reference pulses (over M pulses) is set forth at 592 (CKref_m) which are input to a first gated core circuit and a second gated core circuit. Additional input to the first gated core circuit includes a plurality of divided clock pulses (CK-div) at 593 that are output from the feedback divider element with temporarily re-programmed division ratio. The first gated core circuit, in response to the inputs defined above, provides a plurality of up and down pulses as output. The up pulses output from the first gated core circuit are provided to a multiplexer providing an up pulse to other circuitry and the down pulses output from the first gated core circuit are provided to a multiplexer providing a down pulse to other circuitry. The second gated core circuit, in response to the inputs defined above, provides a plurality of up and down pulses as output to a multiplexer which provides an up pulse to other circuitry and a multiplexer which provides a down pulse to other circuitry. For the avoidance of doubt, each gated core circuit and each multiplexer is capable of receiving multiple inputs, where their respective outputs are determined in relation to the received inputs. When enabled, the multiplexers of the PFD provide the up and down pulses over M pulses at 594, 595, respectively, to other circuitry to provide increased gain.

Figure 6:
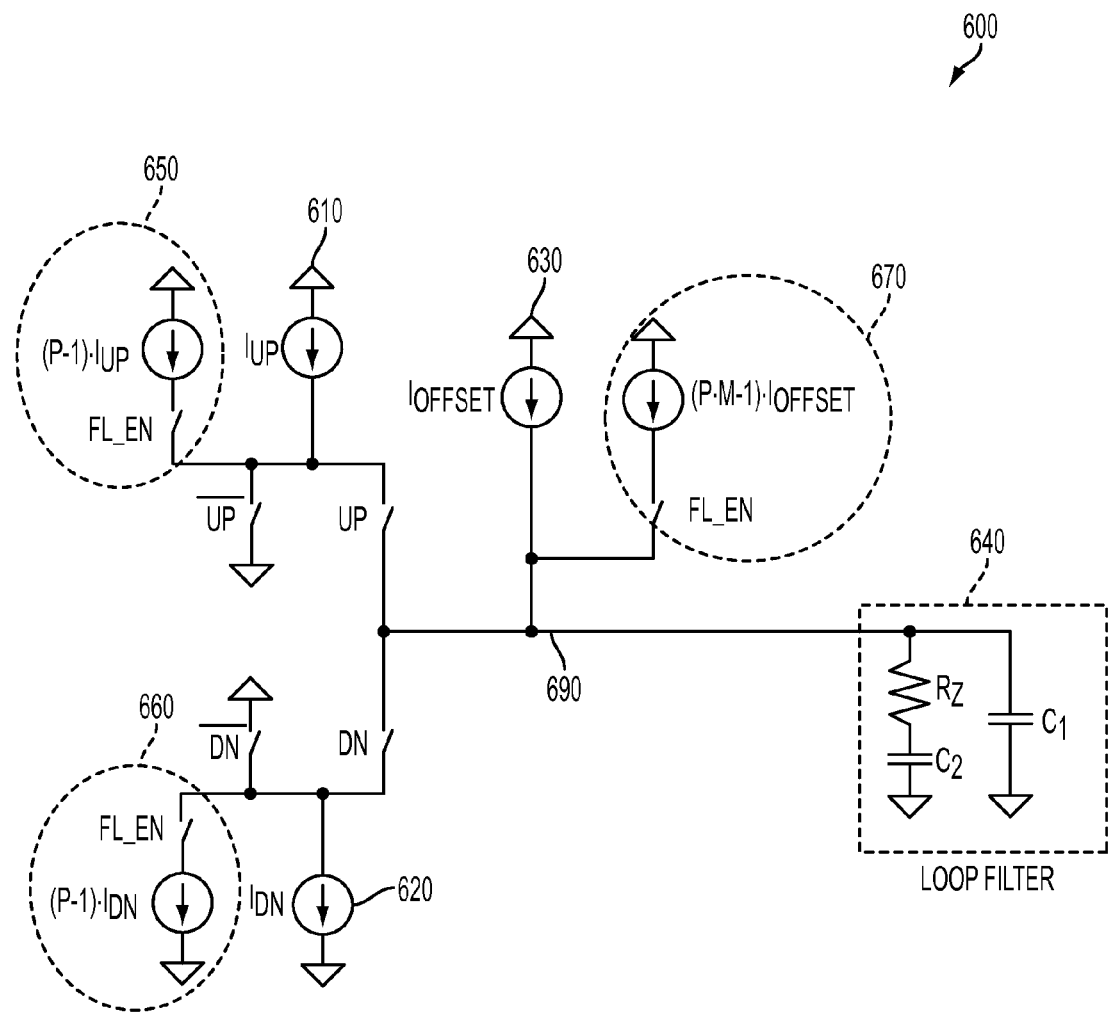
FIG. 6 illustrates a charge pump for fast-locking, in accordance with an embodiment of the present invention.
Figure 7:
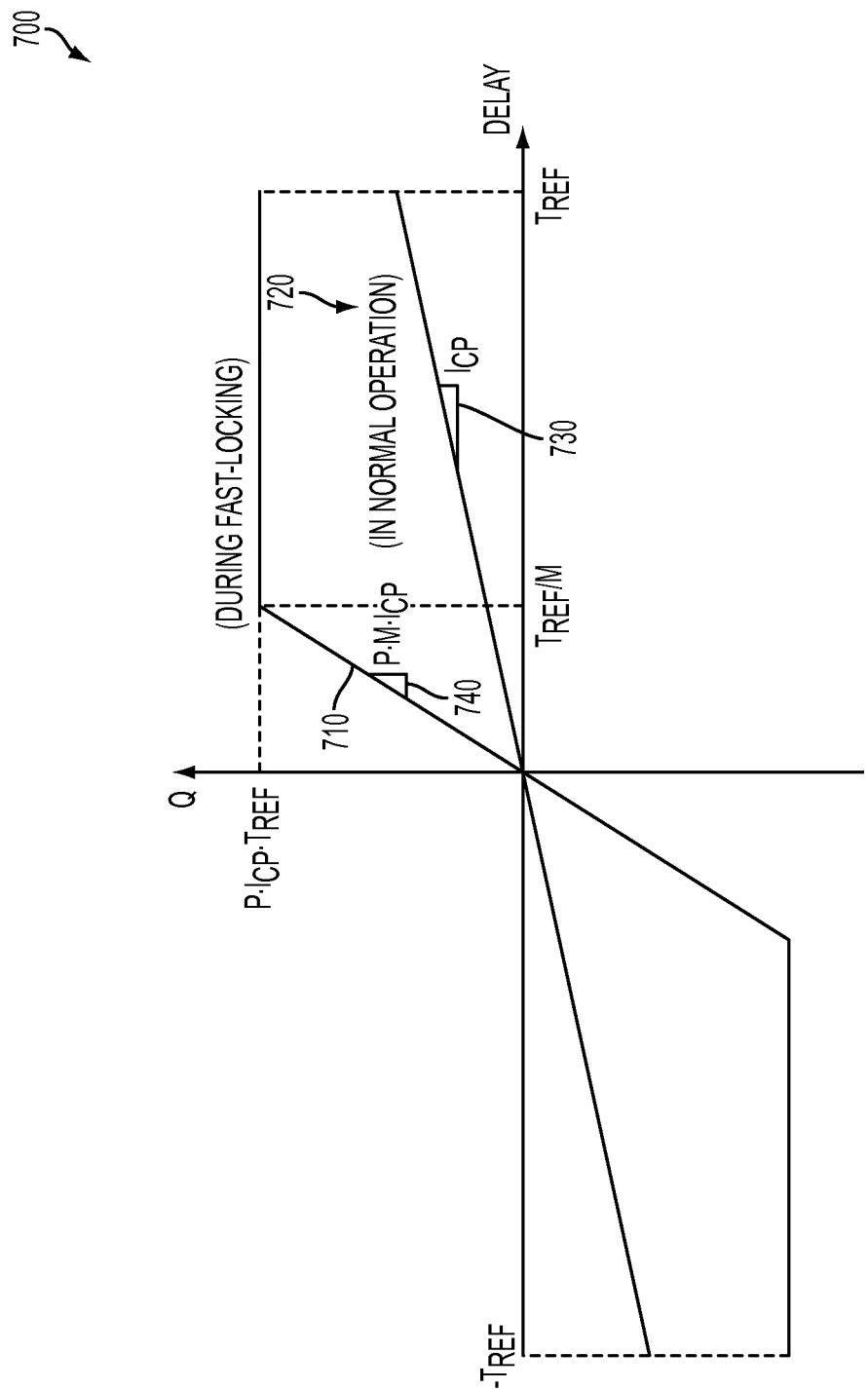
FIG. 7 illustrates a delay transfer diagram for the charge pump of FIG. 6, in accordance with an embodiment of the present invention.

FIG. 6 illustrates a charge pump for fast-locking, in accordance with an embodiment of the present invention. From FIG. 6, a charge pump (CP) 600 includes a sourcing element portion 610, a draining element portion 620 and an offset element portion 630. The sourcing element portion 610 and the draining element portion 620 are primarily dominated by control signals UP, and DN, respectively. The CP 600 drives a loop filter at 640. The CP 600, further includes fast-locking element portions at 650, 660, and 670. The fast-locking element portions include a current related by (P−1) to the respective element portion (610, 620 or 630), where P is an integer that implements the bandwidth-extension technique and may be dynamically changed, as may be the situation for certain embodiments for M as well. Fast Logic elements 650, 660 and 670 further include gating control by their respective Fast Lock Control signals (FL_EN), referenced above. In one embodiment, where the phase locking system is still performing phase tracking operation, the offset element portion 630, the sourcing element portion 610 and the draining element 620 are enabled to be conductive simultaneously. In this way, all the electrical charges conducted by all three current branches help to speed up the phase tracking process. From FIG. 6, the sourcing current $I_{UP}$ that may be further supplemented by the FL element current 650 (P−1)*$I_{UP}$ and the offset current $I_{OFFSET}$ that may be further supplemented by the FL element 670 (P·M−1)*$I_{OFFSET}$ cancel out the current $I_{DN}$ as supplemented by the FL element current 660 (P−1)*$I_{DN}$, i.e., the summation of charge amounts injected from the sourcing element 610, the associated FL element 650, the offset element 630, and the associated FL element 670 substantially equals a charge amount flowing into the down element 620 and the associated FL element 660 in steady-state when fast-locking is enabled. After reaching steady state, the fast-locking feature can be disabled by turning off all the FL elements. FIG. 7 illustrates a delay transfer diagram for the charge pump 700 of FIG. 6, in accordance with an embodiment of the present invention. From FIG. 7, when attaining the fast-locking state, the slope of CP 710 of FIG. 6 provides for a faster rise than that of a traditional "normal operation" charge pump 720, where the charge pump current $I_{CP}$ (720) is the rise of the traditional CP whereas the rise of the charge pump of FIG. 6 is (P*M*$I_{CP}$) through $T_{REF}$/M, at 740.

Figure 8:
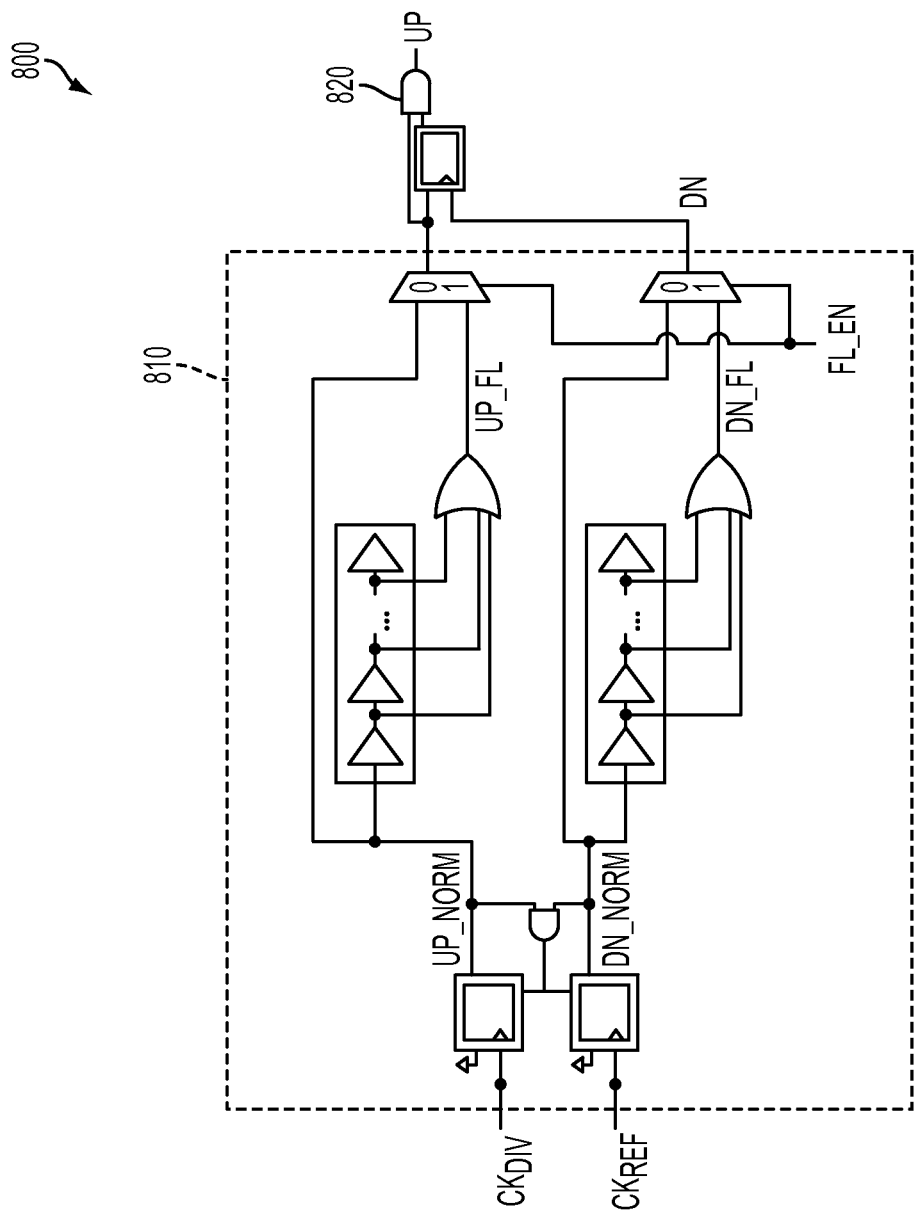
FIG. 8 illustrates a phase frequency detector circuit in accordance with an embodiment of the present invention further including a charge pump.

FIG. 8 illustrates a phase frequency detector circuit in accordance with an embodiment of the present invention further including a charge pump. In FIG. 8, the PFD circuit of FIG. 3A (300) is provided as 810 and is in combination with a charge pump 820. The charge pump 820 is operably configured with the PFD 810.

Figure 9:
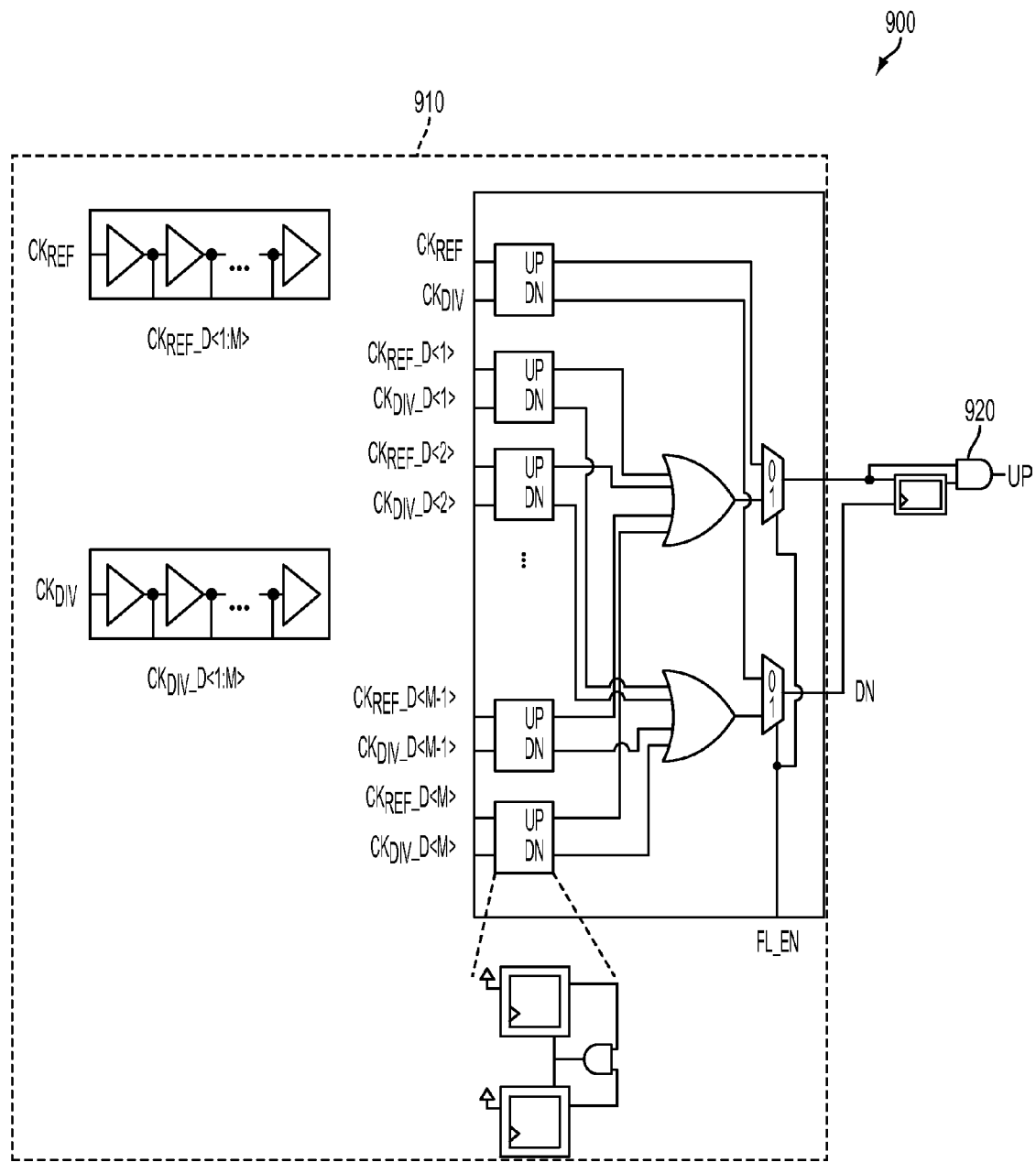
FIG. 9 illustrates a phase frequency detector circuit having a plurality of flip-flops and a charge pump in accordance with an embodiment of the present invention.

FIG. 9 illustrates a phase frequency detector circuit having a plurality of flip-flops and a charge pump in accordance with an embodiment of the present invention. In FIG. 9, the PFD circuit of FIG. 4A (400) is provided as 910 and is in combination with a charge pump 920. The charge pump 920 is operably configured with the PFD 910.

Figure 10:
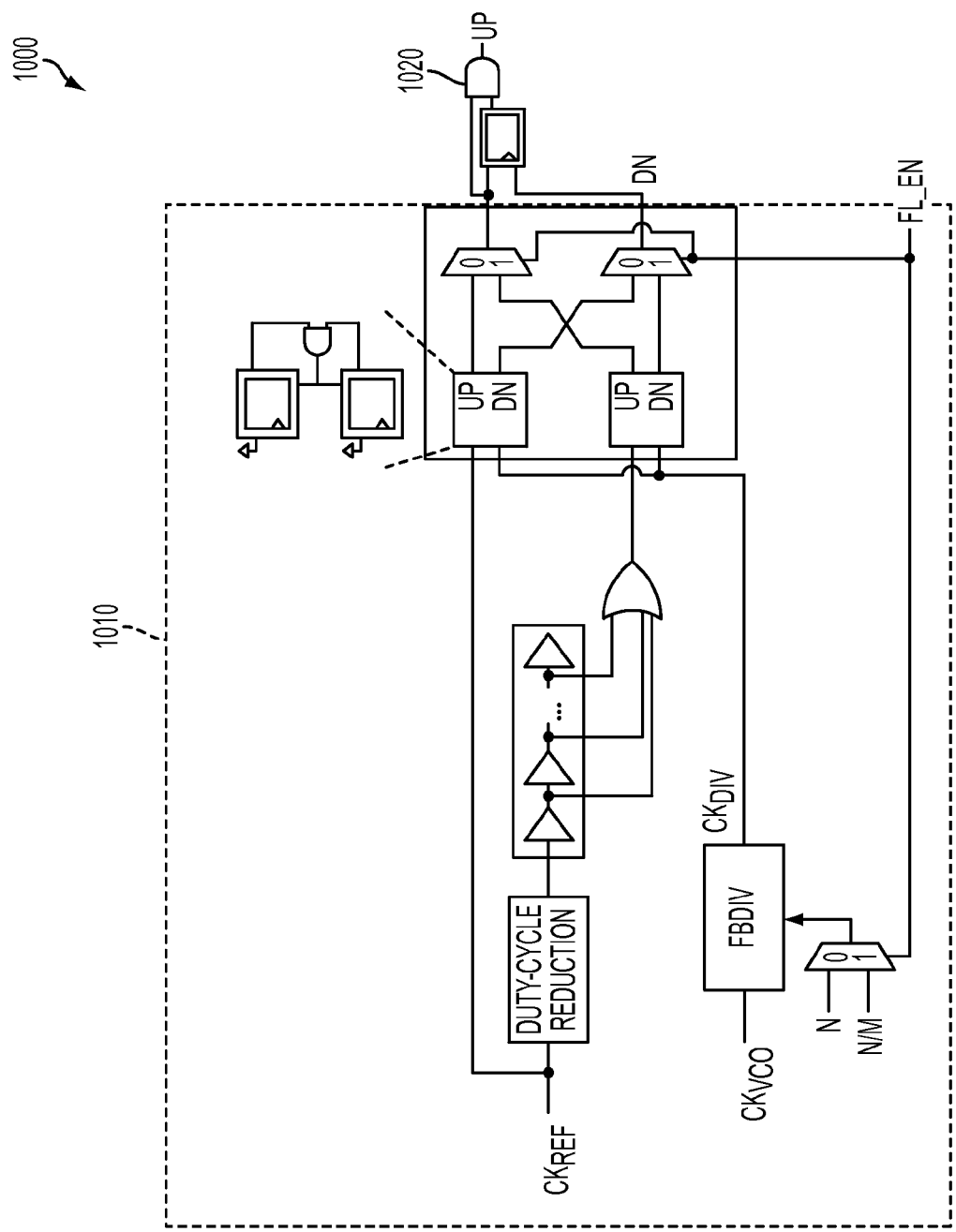
FIG. 10 illustrates a phase frequency detector circuit having delayed reference pulses and a charge pump in accordance with an embodiment of the present invention.

FIG. 10 illustrates a phase frequency detector circuit having delayed reference pulses and a charge pump in accordance with an embodiment of the present invention. In FIG. 10, the PFD circuit of FIG. 5A (500) is provided as 1010 and is in combination with a charge pump 1020. The charge pump 1020 is operably configured with the PFD 1010. In an embodiment, the charge pump 1020 is the charge pump 600 of FIG. 6.

With respect to FIGS. 8-10, in one or more further embodiments, the charge pump further comprises a sourcing element, a draining element and an offset element. In a further embodiment, the sourcing element is arranged to selectively source a first current into an output terminal of the charge pump according to a first control signal, and the draining element is arranged to selectively drain a second current from the output terminal according to a second control signal. In another embodiment, the offset element is arranged to selectively conduct an offset current via the output terminal according to a third control signal, wherein one of the sourcing element and the draining element is disabled when the phase locking system is in a phase-locked state.

Figure 11:
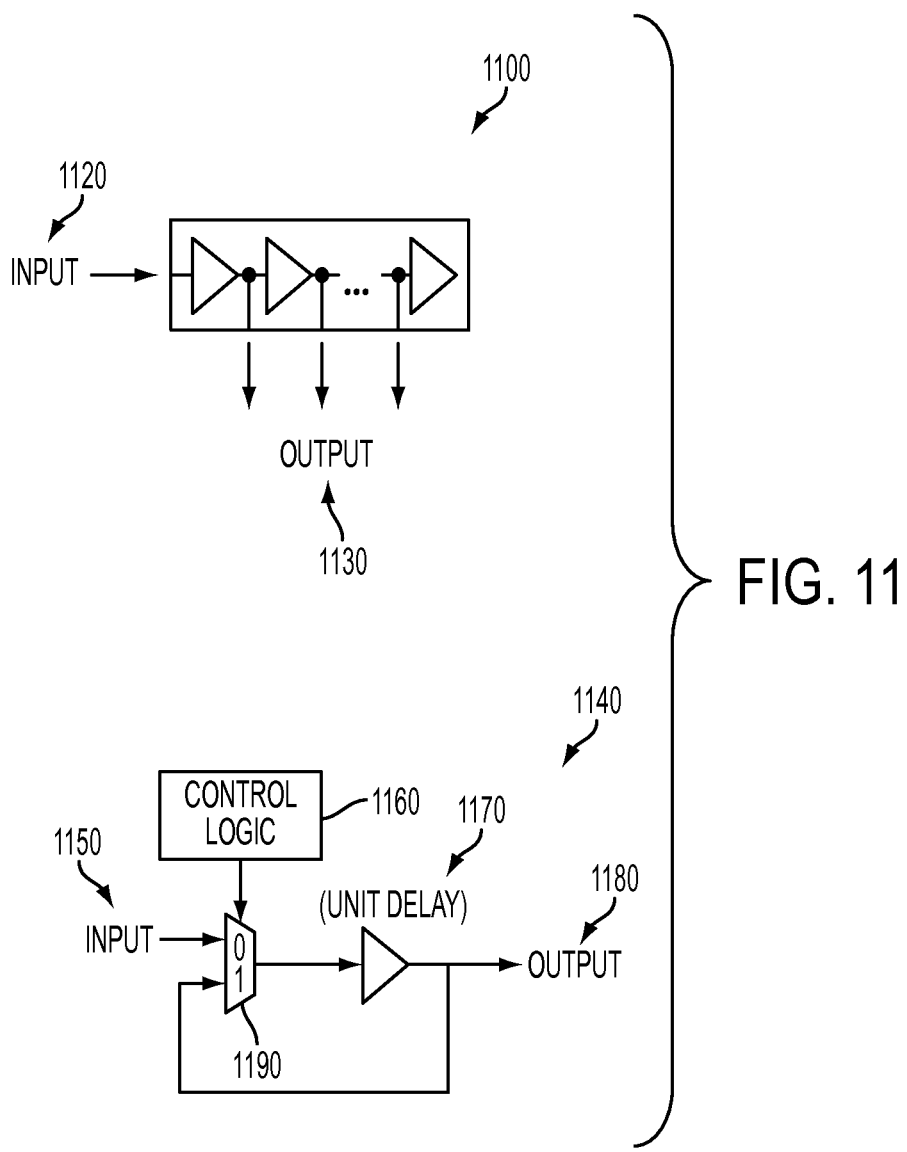
FIG. 11 illustrates an alternative embodiment for the present invention having signal delays with feedback relations.

FIG. 11 illustrates an alternative embodiment for the present invention having signal delays with feedback relations. In FIG. 11, a delay chain 1110 is provided having an input 1120 and a series of outputs 1130. Alternatively, a feedback delay approach 1140 can be used in which the delay chain 1110 is configurable for the feedback delay approach 1140. The feedback delay approach 1140 includes an input 1150, a control logic 1160, a unit delay 1170, output 1180 and a multiplexer 1190. In an embodiment, each of the first and second cyclic delay elements may be further configured in such a feedback delay approach for controlling the respective delayed up and down pulses.

It will be appreciated by those skilled in the art that the embodiments of the present invention in an implementation may operate with a constrained initial frequency error after frequency calibration, which is satisfied in most typical PLL/synthesizer applications (i.e. VCO has a finite number of sub-bands and each sub-band has a well-defined frequency coverage). It will also be further appreciated by those of skill in the art that the embodiments of the present invention can operatively function together with other techniques (e.g. the zero-phase-start technique by properly resetting feedback divider to align clocks CKDIV with CKREF) to achieve a minimal and well-defined initial phase error.

Additionally, the embodiments of the present invention is situated so as to permit dynamically changing the values of for instance M and N, to successively modify loop parameters before switching back to normal operation.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion. Also, the term "couple" is intended to mean either an indirect or direct electrical connection. Accordingly, if one device is coupled to another device, that connection may be through a direct electrical connection, or through an indirect electrical connection via other devices and connections.

What is claimed is:

1. A phase frequency detector comprising:
a delay element, configured to provide a plurality of delayed reference pulses that are each in response to a reference clock signal and within a period of the reference clock signal;
a feedback divider element, configured to provide a plurality of divided clock pulses in response to an input clock signal and a divider input;
a first gated core circuit configured to provide a plurality of up pulses and a plurality of down pulses to other circuitry in response to the plurality of delayed reference pulses and the plurality of divided clock pulses; and
a second gated core circuit, configured to provide the plurality of up pulses and the plurality of down pulses to the other circuitry in response to the reference clock signal and the plurality of divided clock pulses.

2. The phase frequency detector of claim 1, wherein the divider input is of a value of N or N/M where N is an integer value and M is a pulse value.

3. The phase frequency detector of claim 2, wherein the values of M and N are dynamically adapted.

4. The phase frequency detector of claim 1, further comprising a duty-cycle reduction element coupled to the delay element.

5. The phase frequency detector of claim 2, wherein the input clock signal is of a value associated with a voltage controlled oscillator (VCO) and the integer value of N is equal to the frequency of the VCO divided by a reference frequency of a plurality of reference clock pulses of the reference clock signal, and the other circuitry comprises at least one charge pump responsive to receiving one or more signals from the phase frequency detector.

6. The phase frequency detector of claim 1, wherein the delay element comprises one or more delay chains.

7. The phase frequency detector of claim 1, wherein the delay element comprises one or more cyclic delay elements.

8. The phase frequency detector of claim 1, wherein the feedback divider element includes programmable logic, and the first gated core circuit and the second gated core circuit each comprise a plurality of flip-flops.

9. The phase frequency detector of claim 1, further comprising at least one multiplexer configured to selectively output the plurality of up pulses and the plurality of down pulses in accordance with a control signal, wherein the at least one multiplexer is coupled to the first gated core circuit and the second gated core circuit.

* * * * *